United States Patent [19]

Horak et al.

[11] 4,204,866
[45] May 27, 1980

[54] SOLID-STATE COLOR IMAGING DEVICES AND METHOD FOR MAKING THEM

[75] Inventors: Jerry R. Horak, Rochester; Harold F. Langworthy, Webster; Frederick J. Rauner; Robert C. Gross, both of Rochester, all of N.Y.

[73] Assignee: Eastman Kodak Comapny, Rochester, N.Y.

[21] Appl. No.: 867,841

[22] Filed: Jan. 9, 1978

Related U.S. Application Data

[63] Continuation-in-part of Ser. No. 730,885, Oct. 8, 1976, abandoned.

[51] Int. Cl.² .......................... G03C 5/00; G03C 1/84
[52] U.S. Cl. .................................. 430/306; 430/371; 430/396; 430/320; 430/511; 430/518; 313/374; 350/317; 350/96.18; 350/96.2; 358/41; 358/44; 250/227
[58] Field of Search .................. 96/35, 36, 38.2, 35.1, 96/36.4, 117, 118, 25, 80, 84 A; 313/65-68, 36, 371-374; 350/166, 162 SF, 317, 96.18, 96.2; 427/248 H; 358/41, 44; 250/227

[56] References Cited

U.S. PATENT DOCUMENTS

| 2,632,291 | 1/1972 | DeFago et al. | 8/2.5 |
| 2,681,857 | 6/1954 | Rogers | 96/118 |
| 2,750,524 | 6/1956 | Braham | 96/116 |
| 3,623,794 | 11/1971 | Brown | 96/36.4 X |
| 3,940,246 | 2/1976 | DeFago et al. | 8/2.5 |
| 4,081,277 | 3/1978 | Brault et al. | 96/38.2 |

*Primary Examiner*—Edward C. Kimlin
*Attorney, Agent, or Firm*—J. Jeffrey Hawley

[57] ABSTRACT

A color imaging device is comprised of means for sensing radiation comprising a planar array of charge-handling semiconductor photosensors, preferably at least one of the photosensors having a radiation sensing area with at least one dimension less than about 100 microns, and superimposed thereon, filter means for controlling access of radiation to the sensing means. The filter means is in micro-registration with the array of photosensors and comprises a transparent mordant layer with a plurality of radiation intercepting means defining a planar array of filter elements. The filter area of each intercepting means contains at least one mordantable dye which absorbs radiation in at least one portion of the spectrum and transmits radiation in at least one other portion of the spectrum. The color imaging device comprises an interlaid pattern having at least two sets of intercepting means, the first set having a different radiation absorption and transmission characteristic from that of the second set.

6 Claims, 13 Drawing Figures

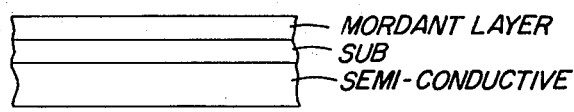
FIG. 5a — AFTER COATING MORDANT LAYER
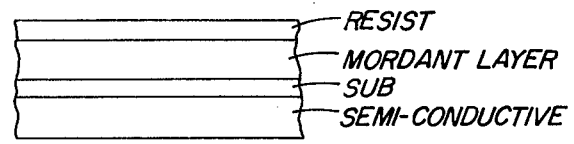
FIG. 5b — AFTER COATING RESIST
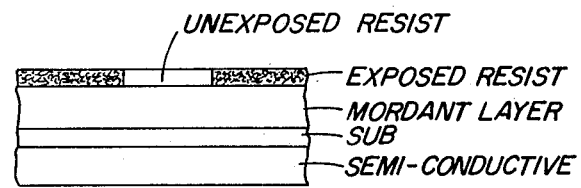
FIG. 5c — AFTER EXPOSURE
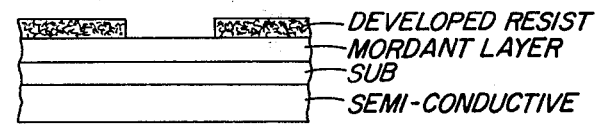
FIG. 5d — AFTER DEVELOPING
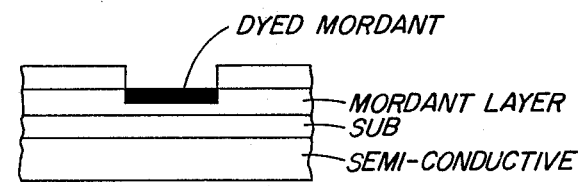
FIG. 5e — AFTER DYE IMBIBITION
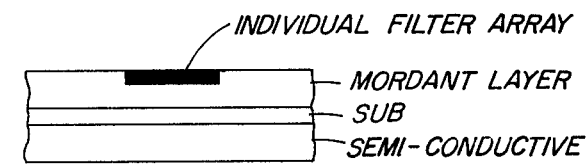
FIG. 5f — AFTER STRIPPING RESIST

SOLID-STATE COLOR IMAGING DEVICES AND METHOD FOR MAKING THEM

This is a continuation-in-part application of Ser. No. 730,885 filed Oct. 8, 1976, now abandoned.

BACKGROUND OF THE INVENTION

1. Field of the Invention

The invention relates to solid-state color imaging devices, particularly to a solid-state photosensitive device that has a planar array of charge-handling semiconductor photosensors in micro-registration with a multicolor planar array of filter elements. The color imaging devices are particularly useful for solid-state video cameras.

2. Description Relative to the Prior Art

A reliable yet sensitive all-solid-state camera would find abundant utility, including, for example, use in television, card readers, facsimile recorders, picturephones, and character recognition, etc. However, in addition to the problems of drift, misalignment and short tube life, non-solid state color cameras suffer from the complications of having to register separate electron beams and to reduce the effects of electron beam lag. Thus, a relatively simple, efficient solid state color camera which would overcome these problems is still sought.

Color photosensitive devices using solid-state image sensors of various types, for example, charge coupled devices, known as CCDs, and charge coupled imagers known as CCIs, have been proposed for and used in video cameras. To avoid optical complexity and problems with image registration, it is highly desirable that color image sensing occur at a single imaging site, e.g., at a single planar photosensitive array. Difficulty is encountered with such "single-site" color imaging, however, because at least three distinct types of color information must be extracted in order to represent a color image in video signal form.

One known approach to providing a "single-site" color sensing device uses a single, fairly large, image sensor of broad wavelength sensitivity and a cooperating filter disc which passes a series of color filters through the image beam in a repeating sequence. The filter interpositions are synchronized to image scanning, a filter typically being interposed during an entire field scan. Devices operating in this manner are said to produce a "field sequential" color signal. One problem with this approach is that the resulting signal presents the extracted color image information in a time order which is radically different from the time order of, say, the standard NTSC video signal. (The standard NTSC video signal is described in Chapter 16, "Television Transmission", of Transmission Systems For Communications, Revised Third Edition, by Members of the Technical Staff of Bell Telephone Laboratories, Copyright 1964, Bell Telephone Laboratories, Inc.) A further disadvantage is that some of the color image information (e.g., blue image information when a blue filter is interposed) tends to be disproportionately detailed and hence wasteful of sensor capacity in relation to the response characteristics of the human eye.

Certain other proposed approaches to achieving "single-site" color image sensing call for the use of striped color filters superposed on a single, fairly large, image sensor. One such type of image sensor uses filter grids which are angularly superimposed on one another (see U.S. Pat. No. 3,378,633). As a result of image scanning, such image sensors produce a composite signal wherein chrominance information is represented in the form of modulated carrier signals. Such apparatus may be adapted to produce signals in the NTSC format or, if desired, the color image information can be separated by frequency domain techniques. In practice, however, it has proven difficult to produce such sensors economically, particularly where detailed image information is required.

Striped filters which transmit a repeating sequence of three or more spectral bands have also been proposed for use in color imaging. With this arrangement, the filters are typically aligned in one direction and scanning of the image is performed orthogonally to that direction. In effect, elemental sample areas are defined along the filter stripes. With this arrangement, it will be appreciated, sampling for a given color is not uniform for both directions. Additionally, the sampling patterns which result tend to provide a disproportionate quantity of information regarding basic color vectors to which the eye has less resolving power, e.g., "blue" information relative to "green" information.

Another approach to "single-site" color imaging which has been proposed is the "dot" scanning system, as discussed in U.S. Pat. No. 2,683,769 to Banning. That approach generally uses spectrally selective sensor elements which are arranged in triads (red, green and blue elements, respectively). In U.S. Pat. No. 2,755,334, also to Banning, another "dot" scanning system is described having a repeated arrangement of four element groupings (red-, green-, blue- and white-sensitive elements, respectively). Such approaches to color imaging have not been of practical significance, in part because of the difficulty and cost of fabricating the number of individual elements which are required to provide image information having adequate detail.

Many of the problems associated with the prior art "single-site" color imaging processes discussed above are overcome by the approach taken in U.S. Pat. No. 3,971,065, issued July 20, 1976, in the name of B. E. Bayer. In the Bayer approach, color imaging is effected by a single imaging array composed of a large number of relatively small individual luminance and chrominance sensing elements that are distributed according to type (sensitivity) in repeating interlaid patterns, the luminance pattern exhibiting the highest frequency of occurrence—and therefore the highest frequency of image sampling—irrespective of direction across the array.

Preferably, to produce an element array according to the Bayer approach, a solid state sensor array wherein each sensor has a broad wavelength sensitivity is provided with a superposed filter array. Filters which are selectively transparent in the green region of the spectrum are preferably employed in producing luminance-type elements, while filters selectively transparent in the red and blue spectral regions, respectively, are preferably employed in producing chrominance-type elements. (The term "luminance" is herein used in a broad sense to refer to the color vector which is the major contributor of luminance information. The term "chrominance" refers to those color vectors other than the luminance color vectors which provide a basis for defining an image.)

Methods for providing a multicolor filter array are known in the art. For example, U.S. Pat. No. 3,839,039, issued Oct. 1, 1974 to Suzuku et al shows a multicolor filter which consists of a plurality of monocolor stripe filters laminated together. Each monocolor stripe filter is made by a process comprising exposing a substrate having a photosensitive surface to light through a striped mask, converting the light image into a metallic image, forming a dichroic layer uniformly on top of the metallic image and removing the portion of the dichroic layer associated with the metallic image. U.S. Pat. No. 3,771,857, issued Nov. 13, 1973 to Thomasson et al shows another multicolor striped filter which consists of a plurality of layers of striped monocolor filters formed successively on top of each other. U.S. Pat. No. 3,623,794, issued Nov. 30, 1971 to S. L. Brown and U.S. Pat. No. 3,619,041, issued Nov. 9, 1971 to D. W. Willoughby show multicolor filters consisting of a lamination of monocolor grating filters comprising photoresist grating patterns filled with dye-vehicle filter materials having preferential absorption in different regions of the visible spectrum.

For one reason or another however, these known methods provide color filter arrays which pose many problems when used with an array of charge-handling semiconductive photosensors. For example, many prior art multicolor filters comprise multiple layers of monocolor filter patterns stacked sequentially on top of each other in order to obtain multicolor filter arrays. However, in order to achieve micro-registration between the filter array and the sensor array, it is desirable for each element in the filter array to be as close as possible to the surface of the underlying photosensor element or elements in the array. This result is most desirably accomplished by producing a relatively thin, single layer multicolor filter array superimposed on the surface of the image sensor. A single layer multicolor filter array substantially reduces the possibility that light rays which pass through a filter element at an angle to the optical axis will strike a photosensor element beneath an adjacent filter element. Further, higher resolution can be obtained by reducing the depth of focus requirements for the optics. These results are not achievable with prior art multiple layers.

SUMMARY OF THE INVENTION

In accordance with the present invention a color imaging device is provided which comprises means for sensing radiation comprising a planar array of charge-handling semiconductor photosensors, preferably at least some of the photosensors having at least one dimension that is less than about 100 microns, more preferably each of the photosensors having a radiation sensing area less than $10^{-4}$ square centimeters, and superimposed thereon, filter means for controlling access of radiation to the sensing means. The filter means is in micro-registration with the array of photosensors and comprises a transparent mordant layer and a plurality of radiation intercepting means defining a planar array of filter element. The filter area of each intercepting means contains at least one mordantable dye which absorbs radiation in at least one portion of the spectrum and transmits radiation in at least one other portion of the spectrum.

Color imaging devices of this invention have an interlaid pattern of filter elements made of at least two sets of radiation intercepting means, each set having a common radiation absorption and transmission characteristic different from each other set. The photosensors lying immediately beneath each set of intercepting means will respond to radiation transmitted by the overlying filter elements. In highly preferred embodiments, each filter element has an edge sharpness less than about 20 microns.

The color imaging devices of the present invention are formed by superimposing the filter means in micro-registration on the sensing means. Generally, it is desirable to have the filter means contiguous with the sensing means; however, in certain embodiments where the filter means are formed on a thin transparent layer of film base (for example, as a substrate), the filter means can be separated from the sensing means by the thin film layer when superimposed on the sensing means (in other words, the thin film support layer can be considered an integral part of the filter means in such embodiments). Even so, for these embodiments, it is preferred to superimpose the filter means on the sensing means with the filter means closest to the sensing means and the transparent substrate on the outer side. The filter means is provided by forming a transparent mordant layer on a substrate. The substrate can be the sensing means itself, a transparent support material which can be superimposed on the sensing means, or a support from which the filter means can be transferred to and superimposed on the sensing means.

A plurality of radiation intercepting means defining an array of filter elements is formed in the transparent mordant layer by:

A. forming a transparent mordant layer on a substrate;

B. coating a layer of photoresist over the mordant layer;

C. exposing the photoresist to a pattern representing a set of filter elements and developing the photoresist to obtain window areas in the photoresist layer corresponding to said pattern;

D. imbibing a dye into the mordant layer through the window areas to fix the dye in the mordant layer by reason of the lateral restraint to dye migration exhibited by the mordant layer, thus forming dyed filter elements corresponding to said pattern;

E. removing the remaining portions of the photoresist to yield a first set of dyed filter elements in a planar array in the mordant layer; and F. repeating steps (B) through (E) at least once to form another set of dyed filter elements in the mordant layer in an interlaid pattern with the first set, each repetition of the steps yielding an additional set of dyed filter elements in an interlaid pattern with the prior sets, each set having a common light absorption and transmission characteristic which differs from each other set.

BRIEF DESCRIPTION OF THE DRAWINGS

FIGS. 5A through 5F depict a sequence of steps in a preferred implementation for forming one color pattern in the filter array in accord with the invention.

DETAILED DESCRIPTION OF THE INVENTION

In accordance with the present invention, a color imaging device is provided which has filter means comprising a plurality of radiation intercepting means defining a planar array of filter elements superimposed in micro-registration on an array of solid-state photosensors. The solid-state photosensors useful in this invention are charge-handling semiconductive photosensors having sensing areas sensitive to radiant energy examples of which include, for instance, charge-coupled devices (also known as charge-coupled imagers, charge-transfer devices, charge-transfer imagers), charge-injection devices, bucket brigade devices, diode arrays, combinations of these, and the like. As used herein, the term "micro-registration" means that the filter means and the sensing means are precisely aligned on a micron scale such that the filter area and underlying sensing area or areas are substantially coextensive with each other. Further, the boundaries of such areas are substantially superimposed. In other words, the position of the filter array is less than micron away from its intended position with respect to the sensor array and further, that each filter element is less than 1 micron away from its intended position in the array. A single filter element may be superimposed over one sensing area or a group of sensing areas in accord with a particular embodiment of the invention.

The filter means comprises sets of dyed filter elements each set having common light absorption and transmission characteristics made by imbibing a mordantable dye into a transparent mordant layer having a mordant for the dyes being used. The mordant layer can also comprise a binder resin to which the mordant is added. The filter means comprises at least two different sets of radiation intercepting means. The filter elements of each set of light intercepting means are imbibed with a dye or dyes having radiation absorption and transmission in a different region of the spectrum from that of each other set. As used herein "radiation" includes any portion of the electromagnetic spectrum that is useful for imaging. The most desirable portion is, of course, the visible spectrum along with parts of the ultraviolet and infrared portions. However, for certain special applications, the term radiation could include other portions of the spectrum.

Figure 1A:
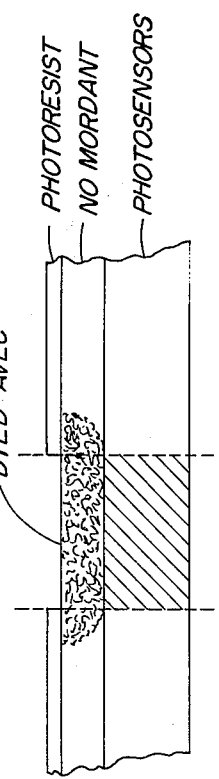
FIG. 1A is a cross-sectional representation, in part, of a color imaging device depicting a filter element in which dye is imbibed into a layer without a mordant.
Figure 1B:
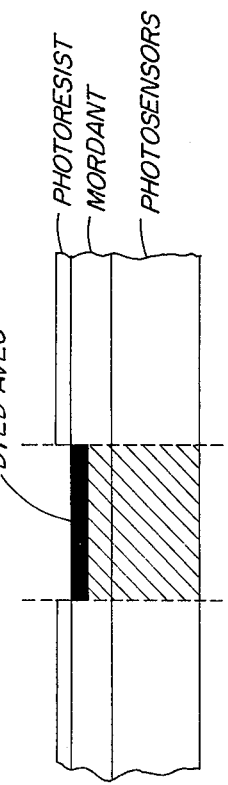
FIG. 1B is a cross-sectional representation, in part, of a color imaging device depicting a filter element in which dye is imbibed into a layer containing a mordant.

The transparent mordant layer is a critical feature of the invention. When imbibing a dye into an area of a dye receiving layer of a non-mordanting type, the dye travels both into the layer and also laterally in the layer. As depicted by FIG. 1A, the lateral diffusion of the dye will affect the photosensitivity of adjacent photosensors in a color imaging device. When imbibing the same quantity of dye into a mordant layer, however, the mordant layer will fix or substantially immobilize the dye molecules and thus restrict the amount of lateral diffusion, as depicted in FIG. 1B. As used herein, the terms "fix" and "immobilize" mean to effectively restrict mobility or to substantially lessen the tendency for diffusion such that dyes fixed or immobilized in a mordant layer will not diffuse sufficiently to substantially affect the sensitivity of adjacent photosensors (including total immobility as the most desirable embodiment.). Thus, the use of a mordant provides for better edge sharpness of the dyed filter area. The term "edge sharpness" as used herein refers to the distance between the minimum absorption and the maximum absorption at the boundary of a dye deposit. The edge sharpness can be determined by measurements taken from a microdensitometer trace across the dye deposit boundary using well known methods. Typically, the edge sharpness of the mordanted dye deposits described herein is less than about 20 microns. In preferred embodiments of the present invention where covalently bonding mordants and dyes are used, edge sharpness is typically less than about 4 microns.

The importance of micro-registration and of fixing the dye molecules to restrict lateral diffusion, i.e. edge sharpness, is readily apparent when one considers the very small size of the sensing areas of the photosensors in a useful color imaging device and thus the correspondingly small size of the superposed filter elements. A color imaging device having suitable resolution consists of an array of over 10,000 photosensors in an area 3×5 mm (see "Charge-Coupling Improves its Image, Challenging Video Camera Tubes" by Tompsett et al at pages 166-167 of *Electronics*, Jan. 18, 1973, pages 162-169). Useful color imaging devices of this invention will generally comprise photosensors having sensing areas with at least one dimension less than about 100 microns and, preferably, having sensing areas of a size less than about $10^{-4}$ square centimeters, and even more preferably less than about $2.5 \times 10^{-5}$ square centimeters. In an especially preferred embodiment each sensing area will be rectangular in shape and have dimensions of 30 by 40 microns. Sensing areas in this preferred embodiment are separated by guard bands approximately 4 microns or less in width. In these embodiments, the dyed areas of adjacent filter elements can overlap in areas contiguous to the guard bands. Thus, edge sharpness of filter elements and micro-registration of each filter element with the underlying photosensor or photosensors are extremely important. It will be readily appreciated that where dye deposits have edge sharpness significantly worse than about 20 microns, it will not be possible to form a color filter array that does not produce significant cross-talk between adjacent sensor areas even when using sensor arrays having 4 micron guard bands. Thus in preferred color imaging devices according to the present invention, edge sharpness of each filter element is less than 20 microns.

Figures 2A, 2B:
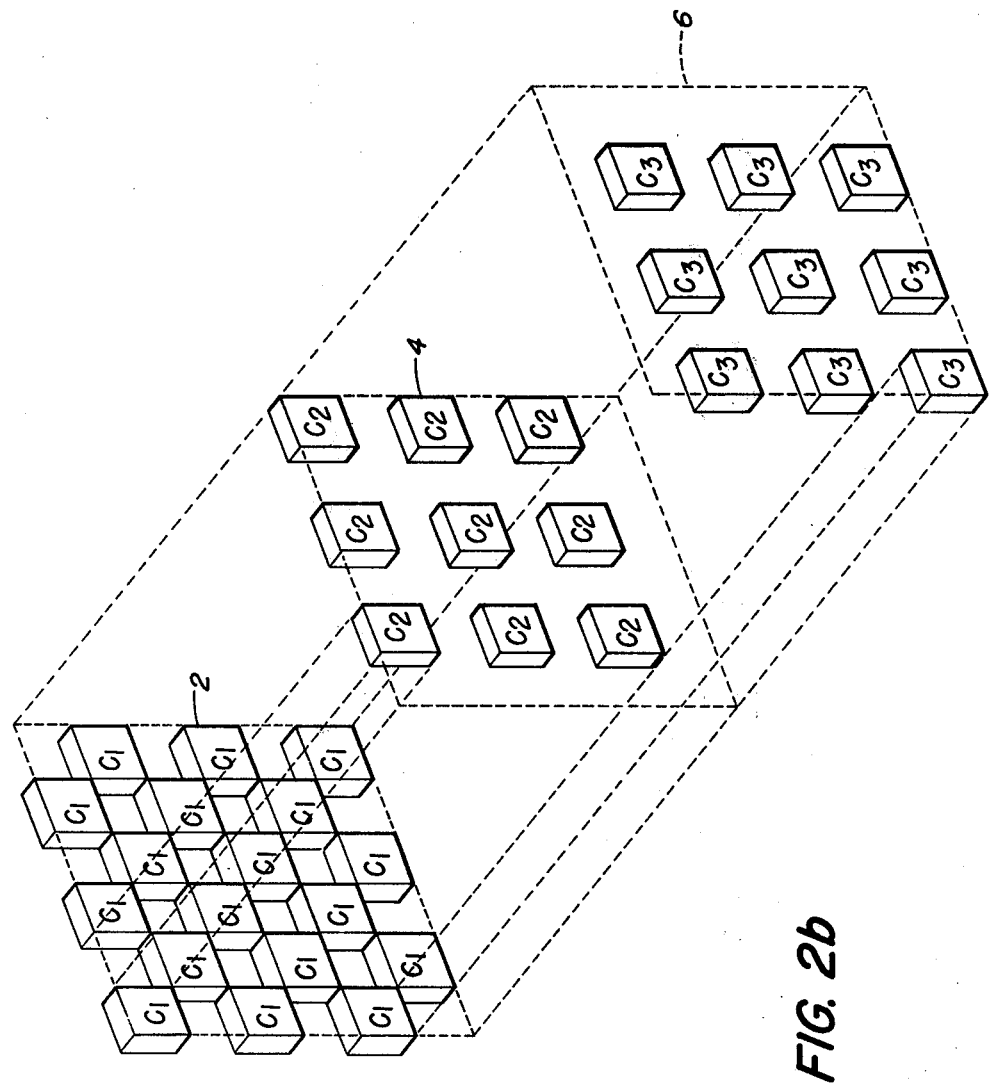
FIG. 2A is a pictorial representation of a multicolor filter array formed in accord with a preferred embodiment of the invention.
FIG. 2B is an exploded pictorial representation corresponding to the array depicted in FIG. 2A.

An example of a three-color filter having a planar array of filter elements is illustrated in FIGS. 2A and 2B. Three sets of filter elements 2, 4 and 6 form an interlaid pattern to provide the three-color filter array 8. Each set of filter elements 2, 4 and 6 has a common light absorption and transmission characteristic which is different from each other set. In a preferred color imaging device of the invention, the filter 8 is superposed on an array of photosensors so that each individual filter element C is in one to one registration with an individual photosensor. As a result of this arrangement, an image can be sampled for all three color vectors by selecting appropriate dyes for use in the three sets of color patterns 2, 4 and 6 of the filter 8.

Figure 3B:
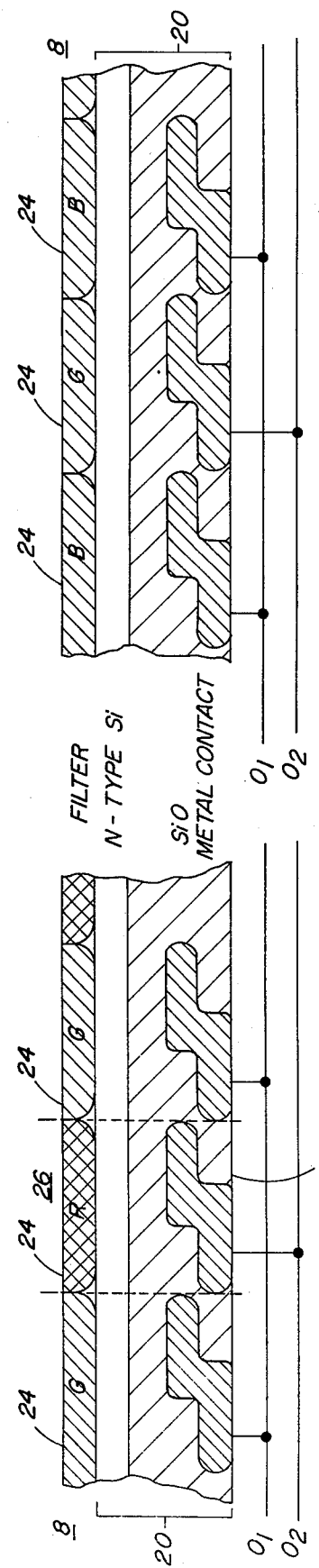
FIG. 3B is a cross-sectional representation, in part, of a row of sensing elements adjacent the row represented in FIG. 3A.
Figure 3A:
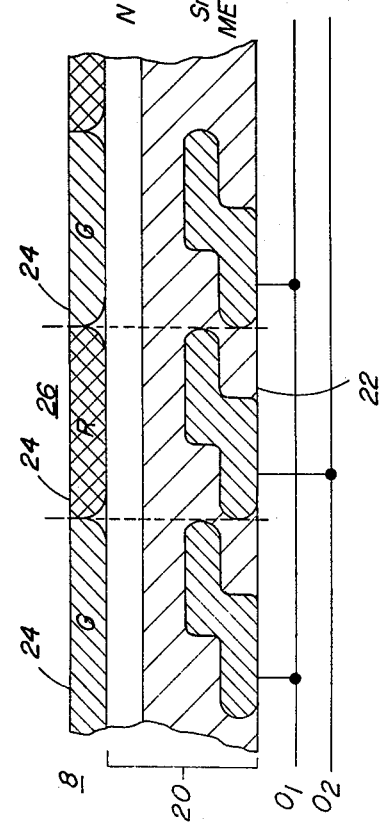
FIG. 3A is a cross-sectional representation, in part, of a row of sensing-elements of a color imaging device having a planar filter array formed in accordance with the present invention.

As illustrated by FIGS. 3A and 3B, a preferred color imaging device of the present invention employs a solid-state imaging array 20 comprised of individual charge-coupled photosensors (e.g., photosensor 22 extending between the dashed lines of FIG. 3A). A filter 8, wherein the $C_1$, $C_2$ and $C_3$ of FIGS. 2A and 2B are now G, R and B, respectively, is superposed on the imaging array 20. The filter 8 includes individual filter elements 24 which are aligned one-to-one with individual photosensors (e.g., photosensor 22) of the imaging array 20 to form a color imaging device of the invention. Individual filter elements 24 of the filter 8 are of the selectively transmitting type and are arranged in patterns as described above with reference to FIGS. 2A and 2B. The letters G, R and B on individual filter areas 24 serve to indicate selective green, red, and blue light transmission characteristics, respectively, of the individual filter elements, as would be employed in accordance with a presently preferred embodiment of a color imaging device of the invention. A preferred color imaging device of the invention comprises an array of color imaging elements 26, each comprising an individual filter element 24 combined with an individual photosensor such as photosensor 22, the combination being selectively sensitive to a particular region of the spectrum.

The filter 8 comprises a transparent mordant layers into which dyes have been imbibed to form patterns 2, 4 and 6 of individual filter areas 24. The mordant layer can take any convenient conventional form. In a preferred form the mordant layer can be a conventional receiver layer of the type employed in dye image transfer photographic elements which typically comprise a polymeric mordant. Examples of mordants and mordant layers useful in the present invention are described in the following U.S. Pat. Nos. which are incorporated by reference: 2,548,564; 2,548,575; 2,675,316; 2,713,305; 2,756,149; 2,768,078; 2,839,401; 2,882,156; 2,940,849; 2,945,006; 2,952,566; 3,016,306; 3,048,487; 3,184,309; 3,271,147; 3,271,148; 3,282,699; 3,408,193; 3,488,706; 3,557,066; 3,625,694; 3-639,357; 3,709,690; 3,758,445; 3,770,439; 3,788,855; and 3,944,424.

Particularly preferred mordants are polymeric mordants which have a plurality of pendant reactive groups which are capable of forming covalent bonds with the dye used. While the exact reason for the improved edge sharpness that results from these mordants in comparison to ionic mordants is not completely understood, it has been found that edge sharpness between 1 and 2 microns can be obtained for these covalently mordanted dye deposits.

The covalently bonding polymeric mordants useful in the practice of this invention have pendant reactive groups. These reactive groups can be selected from benzyl halide groups, sulfonyl groups, and the like. These pendant reactive groups form a covalent bond with certain mordantable dyes such as amine dyes, phenol dyes and the like, that are useful in the practice of this invention.

The covalently bonding polymeric mordants can be prepared from any $\alpha,\beta$-ethylenically unsaturated addition polymerizable monomer or a mixture of such polymerizable monomers. The polymeric mordant can be a homopolymer, copolymer, terpolymer, or the like. Typical unsaturated comonomers useful for polymerizing with the monomers containing pendant reactive groups described herein are, for example, styrene; acrylamide; acrylic and methacrylic acid; acrylic and methacrylic esters such as butyl acrylate, ethyl methacrylate, and the like; olefins such as ethylene, propylene, butadiene, and the like; 2-acrylamido-2-methylpropane sulfonic acid; vinylbenzyl chloride; maleic anhydride; divinylbenzene; and the like. These polymeric mordants can be made by methods which are well known in the art.

Particularly preferred covalently bonding polymeric mordants are polymers wherein the pendant reactive group is a benzyl halide. Polymeric mordants of this type are described in Cohen et al, U.S. Pat. No. 3,944,424. The mordants of Cohen et al can not only contain the benzyl halide reactive group, but also can contain a pendant benzyl quaternary ammonium salt group. Thus, these mordants can mordant both covalently bonding dyes and ionically bonding dyes. The preferred polymers of Cohen et al for use in the present invention include terpolymers comprised of repeating units having the following structure:

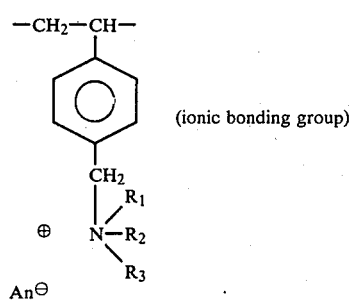

(ionic bonding group)

I.

wherein $R_1$, $R_2$, and $R_3$ are individually selected from a hydrogen atom, and a substituted or unsubstituted alkyl group having from about 3 to about 14 carbon atoms, with the proviso that not more than one of $R_1$, $R_2$ and $R_3$ is a hydrogen atom, and $An^\ominus$ is an anion;

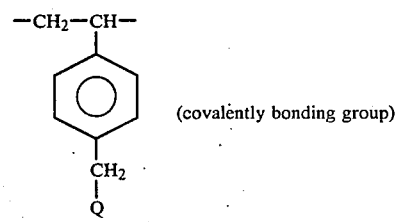

(covalently bonding group)

II.

where Q is a halide such as chloride; and

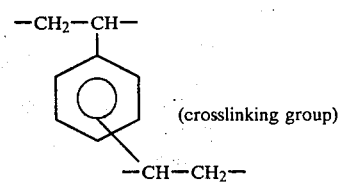

(crosslinking group)

III.

Another group of preferred mordants are those described in commonly assigned copending application Ser. No. 839,879 entitled "Photographic Film Units Containing A Polymeric Mordant Which Covalently Bonds With Certain Dyes", filed Oct. 6, 1977 in the names of Campbell, Cohen, Hamilton and Villard. These mordants also covalently bond with certain dyes and are nonionic, anionic or cationic homopolymers or copolymers containing recurring units having the formula selected from the group consisting of:

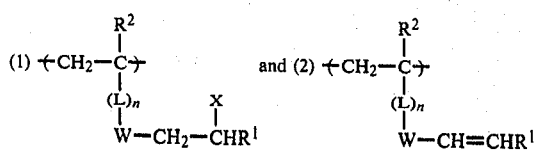
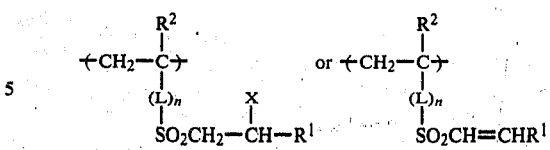

wherein $R^2$ is hydrogen or alkyl; n=0 or 1; $R^1$ is hydrogen, alkyl or aryl; L is a bivalent linking group providing a linkage between the vinyl group and W; W is an electron-withdrawing group and X is a leaving group which can be displaced by a nucleophile or eliminated in the form of HX by treatment with alkali.

When $R^2$ is alkyl, it preferably contains from 1 to 6 carbon atoms such as methyl, ethyl and the like.

$R^1$ can be hydrogen, alkyl preferably containing from 1 to 12 carbon atoms as described above for $R^2$, or aryl preferably containing from 6 to 13 carbon atoms such as phenyl, naphthyl, tolyl, xylyl and the like.

It is understood that throughout this specification that wherever alkyl, aryl or alkylene is described, the terms are meant to include isomers thereof and substituted alkyl, aryl or alkylene wherein the substituent does not adversely affect the covalent bonding of the dye to the polymer.

The linking group L can be selected from the group consisting of alkylene, preferably containing from about 1 to about 6 carbon atoms such as methylene, isopropylene, hexylene and the like; arylene preferably containing from about 6 to about 10 carbon atoms such as phenylene, naphthalene and the like; arylenealkylene preferably containing from about 7 to about 11 carbon atoms such as benzyl; $COOR^3$; and $CONHR^3$ wherein $R^3$ is selected from the group consisting of arylene, alkylene or arylenealkylene such as described above.

X is a leaving group which can be displaced by elimination in the form of HX under alkaline conditions such as hydroxy, chloro, bromo, iodo, alkyl and arylsulfonyloxy ($-OSO_2R'$), ammonio, sulfato ($-OSO_3-$), and the like.

The electron withdrawing group W stabilizes an α-carbanion which facilitates the elimination of HX resulting in an electron deficient double bond. W can be selected from the group consisting of $-SO_2-$, $-CO-$, $-SO-$,

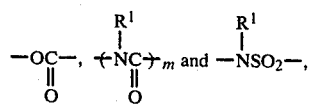

wherein m is 1 or 2 and $R^1$ is as described above.
When n=0 in formulas (1) or (2) then W is $-SO_2-$ or

A highly preferred class of polymers according to the structure described above has repeating units having the formulae:

wherein $R^1$, $R^2$, L, n and X are as described above. Examples of these polymers are poly(vinylbenzyl 2-chloroethyl sulfone), poly(vinylbenzyl vinyl sulfone) and the like. A description of the preparation of these polymers can be found in copending U.S. patent application Ser. No. 839,880, now U.S. Pat. No. 4,161,407, filed Oct. 6, 1977, by Campbell, entitled "Crosslinkable Polymers Having Vinylsulfonyl Groups or Styrylsulfonyl Groups and Their Use as Hardeners for Gelatin."

The polymers containing the recurring units described above preferably comprise anionic, cationic or nonionic polymers comprised of the above units and units derived from copolymerizable ethylenically unsaturated monomers. Although the preferred copolymerizable monomers form units which act as mordants for dyes in themselves, basically any polymerizable monomer may be used to form the polymeric mordant.

Cationic polymers can be formed by copolymerizing monomers forming the units described above in formulas (1) and (2) and monomers which form repeating units such as:

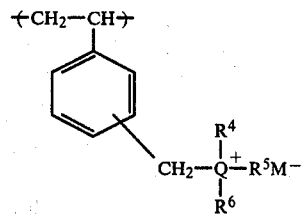

wherein Q is N or P, $R^4$ to $R^6$ are independently carbocyclic or alkyl groups, and $M^-$ is an anion such as described in U.S. Pat. No. 3,958,995, and other cationic units such as N-(methacryloyloxyethyl)-N,N,N-trimethylammonium methosulfate, N-(methacryloaminopropyl)-N,N,N-trimethylammonium chloride, and the like.

Anionic polymers can be formed by copolymerizing with the monomers forming the units described in formulas (1) and (2), monomers which form repeating units such as sodium-2-sulfoethyl methacrylate, sodium 2-acrylamido-2-methylpropanesulfonate, sodium vinylbenzylsulfonate, sodium vinylbenzenesulfonate, and the like.

Nonionic polymers can be formed by copolymerizing with the units of formulas (1) and (2), monomers which form repeating units such as acrylamide, N-vinylpyrrolidinone, N-isopropylacrylamide, and the like.

The polymers can be either homopolymers having the repeating units of formulas (1) and (2) or copolymers of these with other cationic, anionic or nonionic ethylenically unsaturated monomers. Preferred cationic copolymers are poly[m and p-vinylbenzyltrimethylammonium chloride-co-m and p-vinylbenzyl 2-chloroethyl sulfone] (1:1 w) and poly[m and p-vinylbenzyltrimethylammonium chloride-co-m and p-vinylbenzyl vinyl sulfone-co-divinylbenzene] (49:49:2 w). A preferred anionic copolymer is poly[m and p-vinylbenzyl 2- chloroethyl sulfone-co-sodium 2-sulfoethyl methacrylate] (1:1 w).

A preferred nonionic copolymer dye mordant of this type is poly[acrylamide-co-vinylbenzyl 2-chloroethyl sulfone] (80:20 w). Preferably, the copolymers comprise from about 10 to about 90 weight percent of the repeating units of formulas (1) and (2).

The homopolymers or copolymers can be formed by free radical polymerization of the corresponding monomers and by optionally treating the resulting polymers with alkali.

The transparent mordant layer can be formed essentially from the polymeric mordant alone or it can comprise the polymeric mordant in a resinous binder. The resinous binder can be any conventional natural or synthetic resin selected to improve the physical properties of the mordant layer such as, for example, to improve adhesion to the substrate, or to facilitate the imbibition of dye into the mordant layer to react with the polymeric mordant. The preferred terpolymer mordants described above can be employed to form the mordant layer from an aqueous solution. Therefore, suitable useful binder resins that can be employed with these mordants include any of the hydrophilic colloids generally employed in the photographic field, including, for example, gelatin, colloidal albumin, polysaccaharides, cellulose derivatives, synthetic resins such as polyvinyl compounds, including polyvinyl alcohol derivatives, acrylamide polymers and the like. In general, a mordanting amount of the polymeric mordant can be employed in a dye mordanting layer. The amount of dye mordant to be used depends on the amount of dye to be mordanted, the mordanting polymers, the chemistry involved, etc. The amount can be determined easily by one skilled in the art.

Any mordantable dye can be used in the practice of this invention. Preferred dyes include any conventional mordantable dye employed in dye image transfer photographic elements. Typical examples of such mordantable dyes are described in the above patents relating to the polymeric mordants. Some specific examples include, for example: Anthracene Yellow GR (400% pure Schultz No. 177), Fast Red S Conc. (Color Index 176), Pontacyl Green SN Fx. (Color Index 737), Acid blue black (Color Index 246), Acid Magenta O (Color Index 692), Naphthol Green B Conc. (Color Index 5), Brilliant Paper Yellow Ex. Conc. 125% (Color Index 364), Tartrazine (Color Index 640), Metanil Yellow Conc. (Color Index 138), Pontacyl Carmine 6B Ex. Conc. (Color Index 57), Pontacyl Scarlet R. Conc. (Color Index 487) and Pontacyl Rubine R. Ex. Conc. (Color Index 179).

Dyes that are particularly useful in the practice of this invention in combination with the preferred covalently bonding polymeric mordants described above are those dyes having a reactive amine group having the formula:

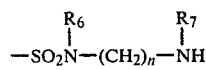

wherein $R_6$ and $R_7$ are each a substituted or unsubstituted lower alkyl group and n is an integer from 1 to about 5. Some examples of such dyes having a reactive amine group which is not part of the chromophore of the dye include:

1-hydroxy-5-methylsulfamyl-4-{m[-2-(n-methyl amino)-ethyl-n-methyl sulfamyl phenyl]azo}-naphthalene;

1-hydroxy-5-{m[-2-(n-methyl amino)ethyl-n-methyl sulfamyl]phenyl sulfamaonamido}-4-{[2-(methyl sulfonyl)-4-nitrophenyl]azo}-naphthalene; and 2-cyano-4-{m[-2-(n-methyl amino)ethyl-n-methyl sulfamyl]phenyl azo}-phenol.

Color imaging devices having a multicolor filter layer according to the invention are produced by coating a mordant layer as described above on a planar array of photosensors, e.g., a charge-handling semiconductor device, or alternatively, coating a mordant layer on a suitable substrate which can be superposed on the array of photosensors or from which the mordant layer can be transferred to the array of photosensors. Dyes are then imbibed into the mordant layer in predetermined patterns to obtain a filter layer having the required color transmission and absorption characteristics for, say, NTSC video image reproduction.

To produce the multicolor filter layer in accord with one embodiment of the invention, a semiconductive substrate having a mordant layer (FIG. 5A) is first overcoated with a photoresist (FIG. 5B). Any suitable photoresist can be used. Suitable photoresists are selected so that they are compatible with the mordant layer and are soluble in a different solvent system than the dyes to be imbibed into the mordanting layer. In general, both positive-working and negative-working photoresists may be used although the particular photoresist should be selected for the particular mordant and dye system being used. Examples of photoresists suitable for the practice of this invention are described in U.S. Pat. Nos. 2,610,120; 2,670,285; 2,670,286; 2,670,287; 2,725,372; and 3,046,125. Polyvinyl cinnamate resists are particularly preferred for use with the preferred benzyl chloride containing polymeric mordants described above.

The photoresist is exposed to a pattern that corresponds to a set of filter elements (e.g., pattern 2) as illustrated by FIG. 5C. The photoresist is developed to leave an open area in the photoresist corresponding to each filter element in the set (see FIG. 5D). A solution of a dye is applied and the dye is imbibed into the mordant layer (see FIG. 5E). The remaining photoresist is dissolved away from the mordant layer and the sequence is repeated for each additional set of filter elements required. By repeating the sequence of steps twice, i.e., exposing two additional patterns such as patterns 4 and 6 (one in each sequence of steps) and imbibing a different dye in each sequence, a multicolor filter element 8 as illustrated by FIG. 2A can be produced.

If the substrate used for coating the mordant layer is a charge-handling semiconductor device, the above sequence of steps for forming a multicolor filter array produces a color imaging device in accord with the present invention. If the filter layer is formed on another substrate such as film base or the like, the filter layer can be stripped from the substrate and superposed on the charge-handling device such that the filter array is in micro-registration with the photosensor array, or the filter layer and substrate combination can be so superposed on the charge-handling device, provided that the substrate is transparent to the radiation used to activate the photosensors.

Preferred color imaging devices of the invention are those having filters that selectively transmit green, red and blue light to respective patterns of photosensors.

These devices can be made by imbibing green, red and blue dyes in appropriate patterns according to the steps described above. Alternatively, these devices can be made using subtractive primary dyes—i.e., yellow, magenta, and cyan dyes. In any given filter element an appropriate combination of two of these dyes would be present to provide a green, red, or blue filter. The above-described procedure for making the color filter would then require that two dyes be imbibed into the mordant layer to form a set of filter elements during each masking-exposure sequence. Alternatively, a single subtractive primary dye can be imbibed into the mordant layer for two of the three sets of filter layers during each masking-exposure sequence. Two additional sequences would complete the three-color filter. Obviously various combinations of these procedures can be used depending upon the characteristics of the dyes which are being used.

Figure 4:
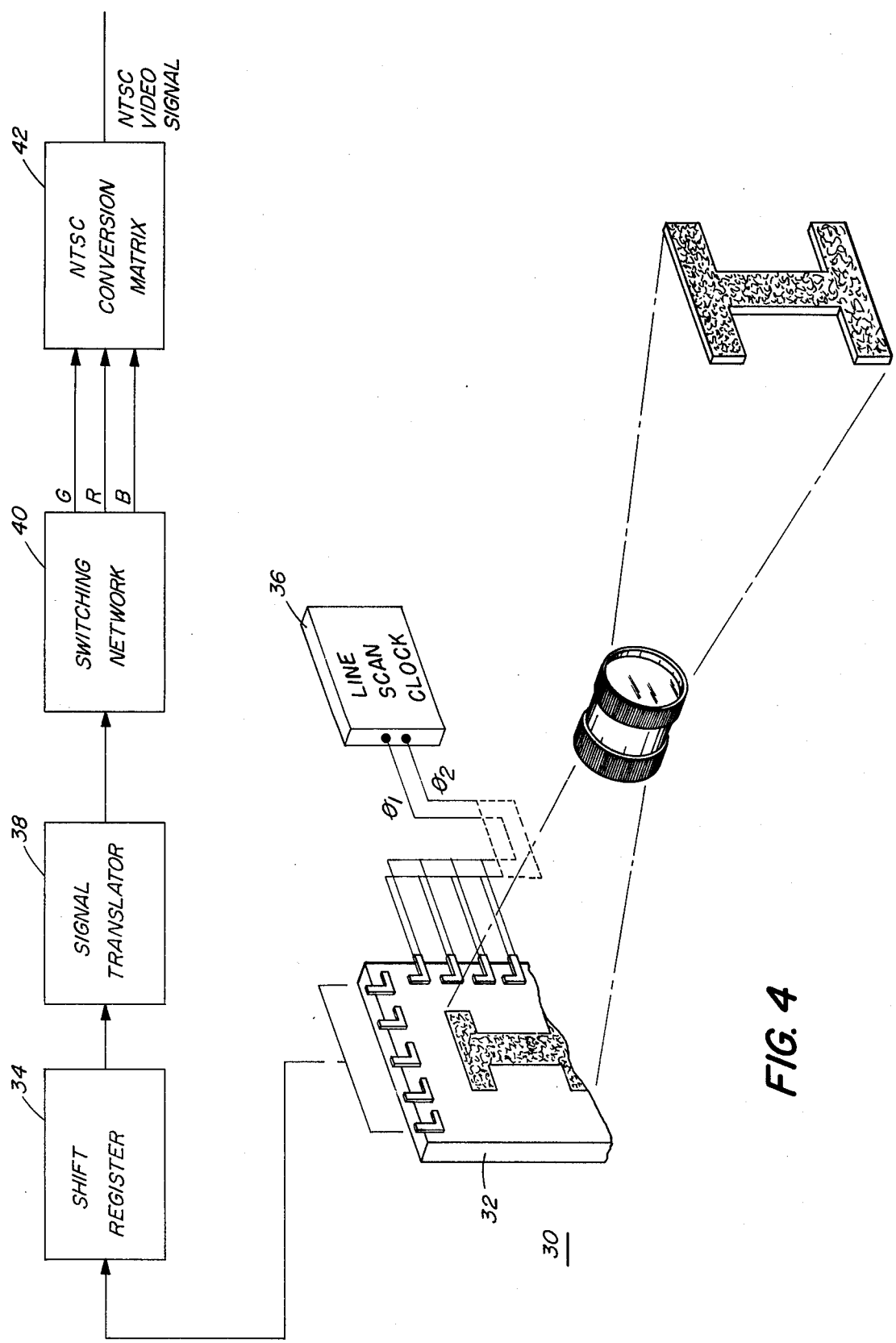
FIG. 4 is a perspective representation showing a basic arrangement of elements for a camera system using a color imaging device according to the invention.

Referring to FIG. 4, a color imaging device 30 according to the invention is shown in a simplified camera environment. Image information from individual rows of photosensors, such as a row 32, is transferred to a shift register 34 (generally formed "on board" the imaging chip) in response to signals from an interrogating apparatus such as a line scan clock 36. Such operation is well known, and apparatus for performing same is described in literature and patents regarding charge-handling devices such as CCD and CID arrays. It is also generally known to process the output signal of the register by means of a circuit 38. Using color imaging arrays according to the invention, however, information for the various base color vectors is interspersed as a result of the intermixed sensitivities of the color array elements. Accordingly, a switching network 40 is provided to separate the image signal sequence to a usable form, for example, to parallel green, red, and blue video signals.

In such form, the signals are conveniently converted to NTSC format using a conversion matrix 42. This is especially convenient if the number of rows in the array corresponds to the number of visible lines in a field scan (approximately 250) or the number of visible lines in a frame (approximately 500) comprised of interlaced fields.

Unless otherwise specified, the following conditions apply to the examples which follow.

Gelatin suspensions of the polymeric mordants were made up for coating the specimen on polyester film base or glass. Where the coatings were made on polyester film, a 0.006 mil blade was used, the polyester was subbed with a copolymer methylacrylate, vinylidene-chloride and itaconic acid according to the teachings of U.S. Pat. No. 3,271,345 to improve adhesion of the mordant layer to the polyester, and the dried coating of gelatin-polymer was about 10 μm thick.

Resist coatings were prepared on a Headway Research EC 101 spinner operating at 2500 RPM for 20 seconds. The coatings were then dried in an oven at 75°-80° C. for 15 to 20 minutes.

Exposure masks were prepared and contained one pattern for each of the colors. The patterns corresponded to the patterns in FIG. 2A. The pattern on the mask was a single 100×100 array, centered in the 2½ inch square mask, and of the same dimensions as the CCD array with which the filter pattern was to be eventually joined.

Exposure and mask alignment was accomplished on a silicon wafer aligner made by Photo-Lithographic Systems, Fort Washington, Pa.

The following examples are presented.

EXAMPLE 1

A substrate material of subbed 3 mil polyester film was coated with a thin layer of a polymer mordant composition having a structure comprised of

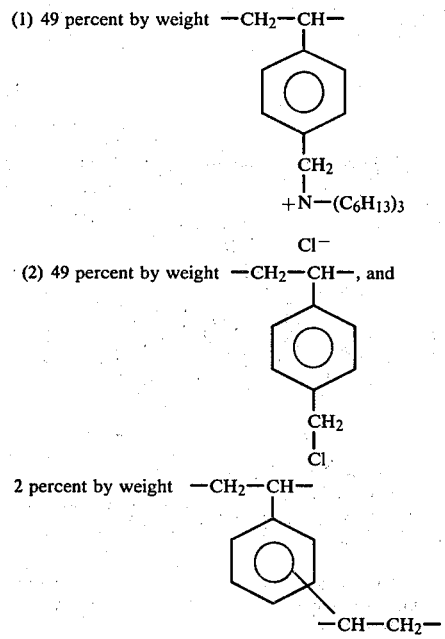

in a gelatin binder (2% gelatin, 0.06% polymer, 0.01% formaldehyde, weight percents). This polymer mordant has the proper surface characteristics (the resist lays down readily and with good adhesion, little or no dye penetration occurs through the adhering resist to the protected polymer, yet the polymer itself reacts readily with the dye solution, and the resist processing sequence has no adverse affect upon the polymer) so that it was possible to lay down a thin layer of protective photoresist.

A layer of polyvinyl cinnamate resist available as KPR Photoresist from Eastman Kodak Company was coated on the mordant layer and dried. The first exposure was made through a chromium mask so that only the polymer mordant under the unexposed areas of the resist would accept magenta dye (dye #1) after development. Exposure was made for six seconds in a Photo-Lithographic Systems silicon wafer handler and exposure using the built-in 200 watt mercury arc source.

The resist was developed for thirty seconds by spraying with Kodak Photoresist Developer. A dip in dye #1 solution (made basic by ammonia with 50 mg dye/100 ml water) dyed the area left unmasked by the resist. The remaining resist was stripped with dichloroethane on a cotton swab. The process of resist coating, exposure, dyeing, and stripping was then repeated two more times substituting a different exposure mask and solutions of dye #2 and dye #3 were used each time to provide the desired three color pattern. The sequence of dye application has no effect upon subsequent dyeing in a previously masked area. The resolution obtained was more than sufficient to give quite sharp edges to the dyed